Figure 1:
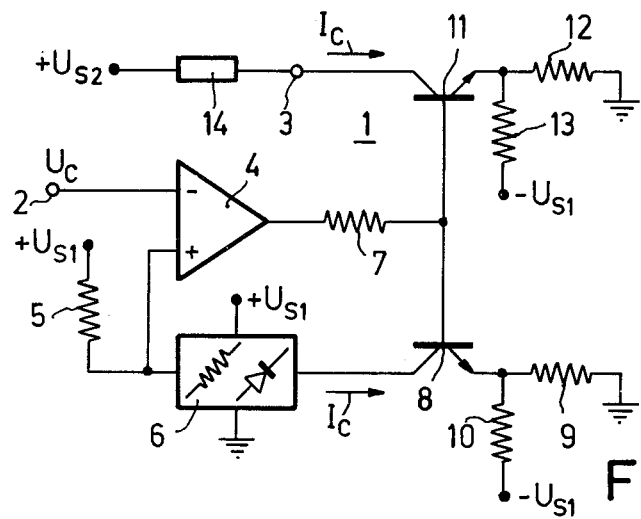

United States Patent [19]
Boer

[11] 3,956,645
[45] May 11, 1976

[54] CONTROLLABLE CURRENT SOURCE
[75] Inventor: Dirk Boer, Eindhoven, Netherlands
[73] Assignee: U.S. Philips Corporation, New York, N.Y.
[22] Filed: Mar. 14, 1975
[21] Appl. No.: 558,211

Related U.S. Application Data
[63] Continuation of Ser. No. 392,770, Aug. 29, 1973, abandoned.

[30] Foreign Application Priority Data
Sept. 9, 1972 Netherlands............... 7212293

[52] U.S. Cl................................ 307/264; 307/297
[51] Int. Cl.² ........................................ H03K 1/14
[58] Field of Search.................. 307/296, 297, 269; 328/172, 173, 17 S, 14 S

[56] References Cited
UNITED STATES PATENTS
3,544,882 12/1970 Tanaka........................... 307/296 X
3,675,114 7/1972 Nercessian..................... 307/297 X OTHER PUBLICATIONS
J. W. Mitchell, Monolithic Current Source, IBM Technical Disclosure Bulletin, Vol. 13, No. 12, May, 1971, p. 3720.

Primary Examiner—John Zazworsky
Attorney, Agent, or Firm—Frank R. Trifari; Henry I. Steckler

[57] ABSTRACT
A controllable current source having a high impedance at a control input which for this purpose is connected to a non-fed back input of an operational amplifier present therein, while the amplifier output is fed back to a second amplifier input through a transistor whose collector is connected, possibly through a non-linear resistance network, to the second input which is furthermore connected via a resistor to a supply terminal, the transistor being incorporated in a current mirror circuit including a second transistor supplying the output current at the collector.

7 Claims, 5 Drawing Figures

CONTROLLABLE CURRENT SOURCE

This is continuation, of application Ser. No. 392,770, filed Aug. 29, 1973, now abandoned.

The invention relates to a controllable current source conveying a current at an output which is adjustable as a function of a control voltage to be applied to a control input, in which the control input of the current source formed with a feedback operational amplifier having two inputs is connected to a non-fedback and hence highly resistive input of the amplifier whose output has a feedback to the other amplifier input connected through a resistor to a supply terminal, said feedback furthermore comprising a transistor.

Such a current source may be used for a variety of applications. It is possible to connect the current source to a signal amplifier or attenuator to which a signal to be amplified or attenuated is applied, the amplification or attenuation factor being dependent on the value of the adjusted current. The signal amplifier or attenuator may be considered as a signal multiplier in this case, the multiplication factor for the signal applied thereto being determined by the control voltage to be applied to the current source, which control voltage determines the current to be supplied in accordance with a given function.

In this case it is favourable to load the control voltage as little as possible so that the control input of the current source must have a high input impedance. Especially in case of remote control it is desirable that the input impedance is as high as possible.

Such a current is described in United Kingdom Patent Specification No. 1,266,866. In this current source the emitter of the transistor in the feedback is connected to the fed-back input of the amplifier and the base is connected to its output. The output current is derived from the collector of the transistor.

A drawback of the current source described is that for controlling and maintaining the output current constant, i.e. the collector current of the transistor in the feed-back, the emitter current is utilized. In fact, the emitter current and the collector current are not equal and the difference is dependent on the properties and the operating conditions of the transistor. As a result, a uniform control over the control range and, for example, maintaining the output current constant independent of temperature is not ensured.

It is an object of the invention to provide a controllable current source having a high input impedance for the control input which is simple in structure and provides an accurate and stable adjusted current. To this end a current source according to the invention is characterized in that a collector of said transistor is coupled to the fed-back amplifier input and a base or emitter of which are coupled to the amplifier output, said transistor being furthermore incorporated in a current mirror circuit including a second transistor whose collector is connected to the output of the current source.

Use of the current mirror gives a satisfactory decoupling of a load connected to the current source from the feedback, while the two collector currents are accurately generated, and are, for example, exactly equal to each other.

To obtain a desired non-linear function between the adjustable current and the control voltage the current source is furthermore characterized in that the connection point between the said resistor and the amplifier input is connected through a non-linear resistance network to the collector of the transistor in the feedback.

A very favourable application of the controllable current source is in a colour television camera which is characterized in that in the camera formed with three chrominance channels at least two of them each incorporate a controllable current source which for the purpose of supplying an adjusting current is connected to an input of a signal amplifier formed with a second input for the supply of an image signal to be multiplied in the chrominance channel.

Figure 2:
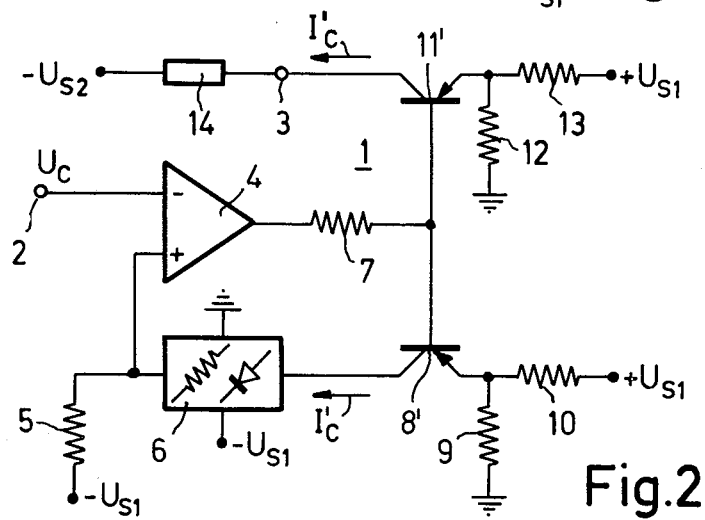
Figure 3:
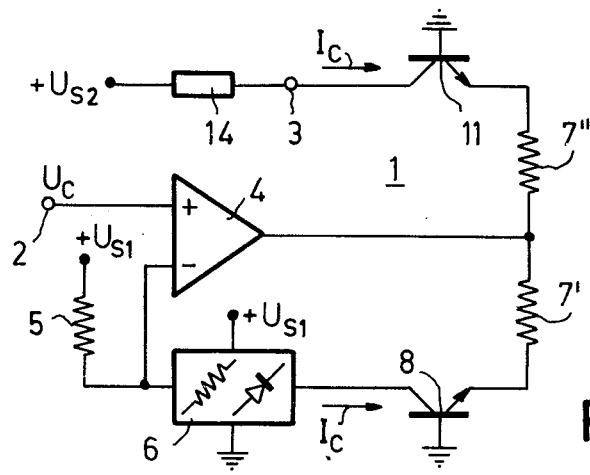
Figure 4:
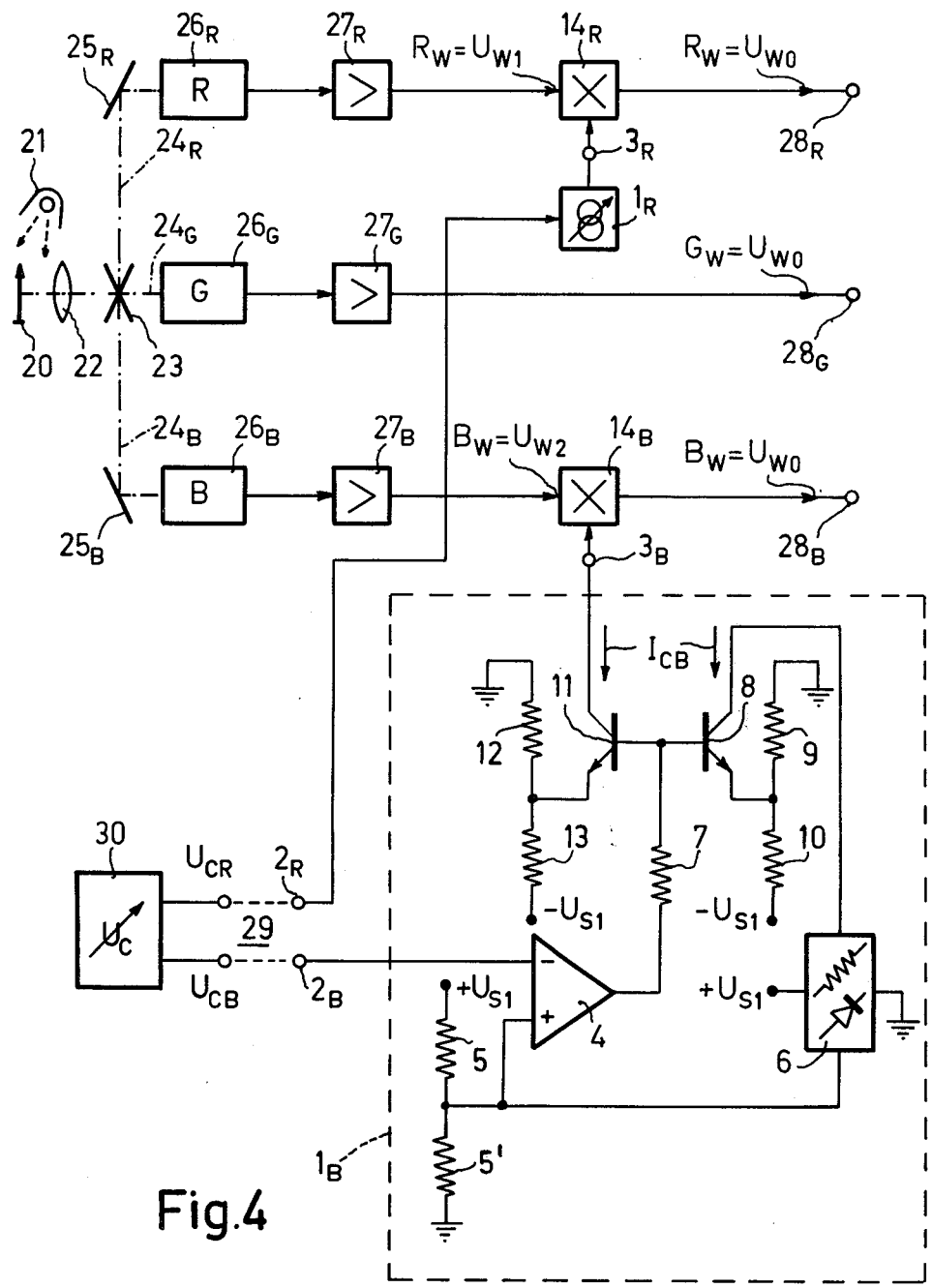
Figure 5:
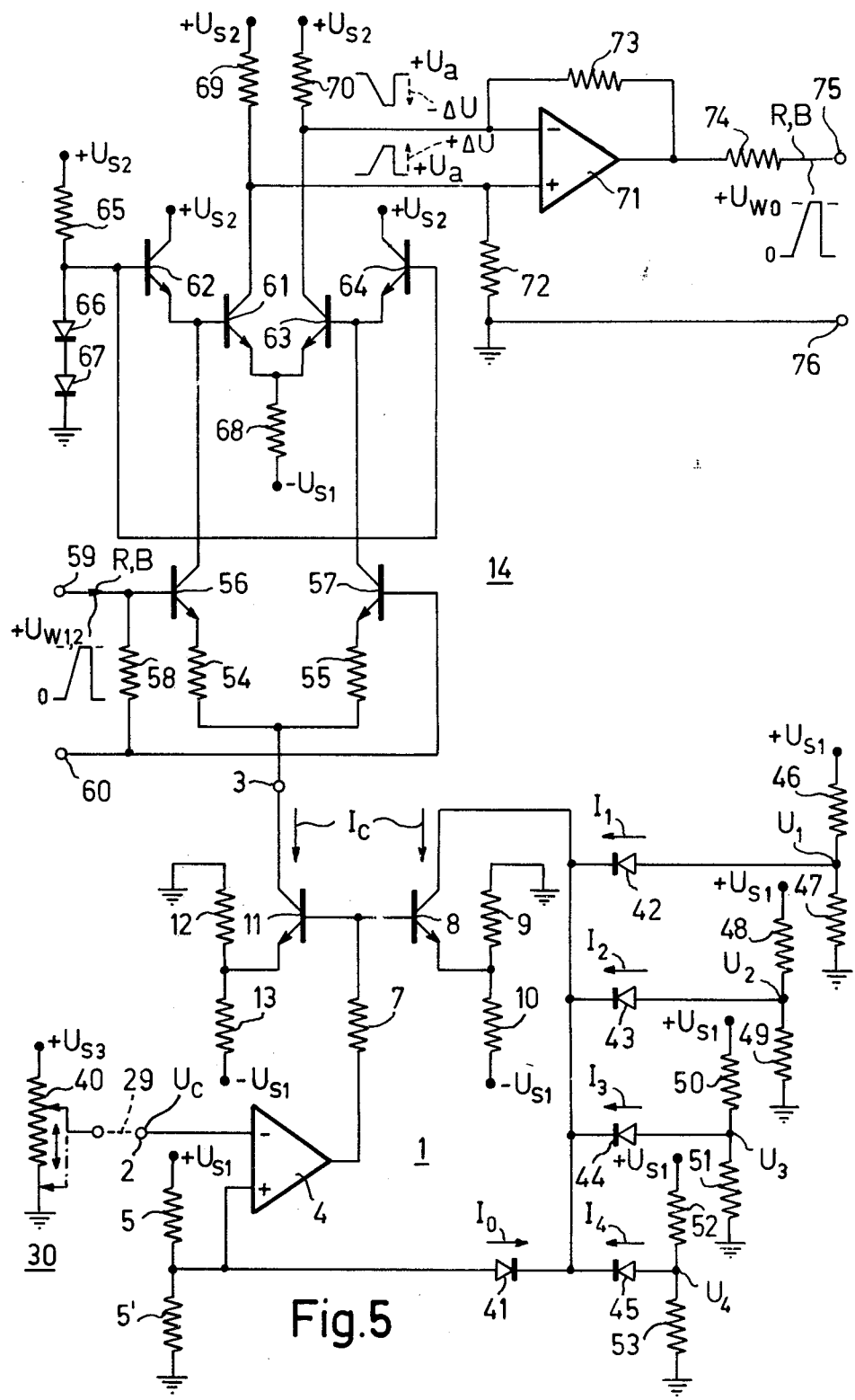

The invention will be described in greater detail by way of example with reference to the following Figures in which FIGS. 1, 2, 3 show some embodiments of a current source according to the invention, FIG. 4 shows the use of the current source according to FIG. 1 in a colour television camera and FIG. 5 shows detailed circuit diagrams associated with FIG. 4 of a current source having a logarithmic control chacharacteristic and of a signal multiplier.

FIG. 1 shows a current source 1 according to the invention in which a control input 2 is shown to which a control voltage $U_C$ is applied and an output 3 which conveys an adjustable current $I_C$. The current source 1 is formed with an operational amplifier 4 which has two inputs and is connected to the control input 2 by means of an inverting (−) input. It is essential that the amplifier input connected to the control input 2 is not included in a feedback loop and thus has a high input impedance for the control voltage $U_C$. The non-inverting (+) input of the amplifier 4 is connected through a resistor 5 to a first supply terminal conveying a voltage $+U_{S1}$ and furthermore it is connected to a non-linear resistance network 6. The supply terminal conveying the voltage $+U_{S1}$ forms part of a supply source not shown having various terminals which are connected to ground or convey a voltage $-U_{S1}$, $+U_{S2}$, $-U_{S2}$ or $+U_{S3}$ all of which terminals are shown in FIG. 5. Likewise in FIG. 5 a detailed embodiment of non-linear resistance network is shown. In FIGS. 1 to 4 the non-linear resistance network 6 is connected between terminals conveying the voltage $+U_{S1}$ and the ground potential. The supply voltages required for the operational amplifier 4 are not shown for the sake of simplicity.

The output of the amplifier 4 is connected through a resistor 7 to the base of an npn transistor 8. The collector of the transistor 8 is connected through the non-linear resistance network 6 to the connection point between the resistor 5 and the (+) amplifier input. The emitter of the transistor 8 is connected through a resistor 9 to ground and through a resistor 10 to a second supply terminal conveying the voltage $-U_{S1}$. The amplifier 4 is thus formed with a feedback (6, 7, 8).

For obtaining the adjustable current $I_C$ at the output 3 of the current source 1 it is applied to the collector of an npn transistor 11 whose base is connected to that of the transistor 8 and whose emitter is connected through a resistor 12 to ground and through a resistor 13 to a third supply terminal conveying the voltage $-U_{S1}$. The transistors 8 and 11 and the resistors 9, 10, 12 and 13 constitute a so-called current mirror circuit to be denoted by (8, 11) in which for the same value of resistors 9 and 12 and 10 and 13 which thus constitute equal loads, the currents flowing in the collectors of the transistors 8 and 11 are equal, which is denoted by the currents $I_C$.

The current $I_C$ at the output 3 flows through a load 14 from a terminal conveying a voltage $+U_{S2}$. The value of the current $I_C$ is essentially independent of the value of the load 14 and is mainly determined by the value of the resistor 5 and the non-linear resistance network 6 which will be evident from the following. For a voltage $U_C$ equal to the ground potential of 0 volt the amplifier 4 will not supply a voltage when the ground potential likewise occurs at the (+) amplifier input. Assuming that the ground potential does not exactly occur at the (+) amplifier input, but a very small negative voltage, it appears amplified as a negative voltage at the output of the amplifier 4. With the aid of the resistors 9 and 10 the emitter of the transistor 8 has acquired such a high negative bias that the negative voltage provided by the amplifier 4 causes the transistor 8 to convey the current $I_C$ at a value which produces a voltage drop across the resistor 5 with the assumed small negative voltage occurring at the (+) amplifier input. The influence of the non-linear resistance network 6 is in this case left out of consideration in the first instance. When the voltage $U_C$ of the ground potential 0 is increased to a positive voltage of, for example, 1 volt, it will appear through the (−) input as a larger negative voltage at the output of the amplifier 4 and cause the transistor 8 to conduct to a lesser extent until the voltage drop across the resistor 5 has decreased so far that likewise a voltage of a substantially +1 volt occurs at the (+) amplifier input. A further increase of the control voltage $U_C$ will likewise result in a lower value of the current $I_C$ until substantially the same voltage value as in the control voltage $U_C$ occurs at the (+) amplifier input. The voltage at the (+) amplifier input is rendered and maintained substantially equal to the voltage applied to the (−) amplifier input through the feedback (6, 7, 8).

If the non-linear resistance network 6 were absent, an equal current variation in the current $I_C$ would occur for each volt variation in the control voltage range of, for example, 0 to +5 volt. The presence of the non-linear resistance network 6 to be described in detail with reference to FIG. 5 causes the variation in the current $I_C$ per volt of control voltage variation to be not a constant but to vary in accordance with a desired given function. Thus it is possible, for example, for a linear variation over the control range of the voltage $U_C$ to cause the current $I_C$ to vary in accordance with a logarithmic function. A current variation of 4 dB per volt of control voltage variation may be taken as an example.

The presence of the non-linear resistance network 6 in the feedback (6, 7, 8) in the amplifier 4 has the advantage that any desired connection between input control voltage and output current can be adjusted through switching operations in the resistance network 6 without the highly resistive character of the control input 2 being influenced thereby. The non-linear resistance network 6 might consist of, for example, a resistance network having biassed diodes while sections of the resistance network are used or not used through the switches operated by the user. The fact that the amplifier input connected to the control input 2 is not fed back in the current source 1 ensures the highly resistive character of the control input 2. In this case it is possible to connect the input 2 via a capacitor not shown to ground which capacitor is provided, for example, for smoothing purposes.

FIG. 2 shows an embodiment of the current source 1 which does not take up the current $I_C$ as described with reference to FIG. 1 but supplies a current $I_C'$. Components already provided with reference numerals in FIG. 1 have the same reference numerals possibly provided with indices in FIG. 2 and the following Figures. The transistors 8' and 11' shown in FIG. 2 are of the pnp type and the resistors 10 and 13 are connected to a terminal conveying a voltage $+U_{S1}$. The resistor 5 is connected to a terminal conveying the voltage $−U_{S1}$ and the load 14 is connected to a terminal conveying the voltage $−U_{S2}$.

It has been shown for the current source 1 in FIG. 1 that the control voltage ranges from, for example, 0 to +5 volt. A negative control voltage $U_C$ may alternatively be applied if the bias across the emitters of the transistors 8 and 11 is adapted in such a manner that the transistors are not driven into saturation with a constant collector current ($I_C$). Relative to the positive control voltage range a greater dissipation occurs in the negative. For the current source 1 given in FIG. 2 there applies that it is not most suitable for a control voltage range having negative voltages $U_C$. At 0 volt in the control voltage $U_C$ the transistors 8' and 11' conduct a current $I_C'$ having a value which decreases for larger negative control voltage values.

FIG. 3 shows an embodiment of the current source 1 in which the (+) input of the operational amplifier is connected to the input 2. The same would have been possible in the embodiment of FIG. 1 when the resistor 7 is replaced by an inverter which then takes over the signal inversion performed through the (−) input. The embodiment of FIG. 3 differs, however, furthermore in that the output of the amplifier 4 is connected through a resistor 7' to the emitter of the npn transistor 8 while the base is connected to ground. Likewise in the current mirror circuit (8, 11) the amplifier output is connected through a resistor 7'' having the same value as the resistor 7' to the emitter of the transistor 11 whose base is connected to ground.

For the current source 1 of FIG. 3 there applies that at the ground potential of 0 volt at the (+) input of the amplifier 4 a very low positive voltage deviating therefrom at the (−) amplifier input yields a negative voltage at the output so that the transistor 8 in the feedback (6, 7', 8) conveys such a current that the aforementioned low positive voltage occurs at the (−) input. A positive voltage $U_C$ results in the output voltage of the amplifier 4 becoming less negative with a transistor 8 conducting less current and this such that the voltage at the (−) input varies with it but is more positive by a value which is still lower than the said very low voltage.

The embodiment of the current source 1 shown in FIG. 3 is suitable for a positive control voltage range, but by connecting the bases of the transistors 8 and 11 not to ground but to a negative bias, a negative voltage range may alternatively be used.

The embodiments of the current source 1 shown in FIGS. 1, 2 and 3 are very suitable for integration in a semiconductor body as a result of the absence of capacitive components. The non-linear resistance 6 may be built up of, for example, a network of resistors and diodes.

FIG. 4 shows a very favourable embodiment of the controllable current source 1 according to the invention in a colour television camera. In the camera two current sources are denoted by $1_R$ and $1_B$. R, B and furthermore G will be used to indicate that circuit components are associated with a chrominance channel conveying a television image signal corresponding to a red, a blue and a green light component in the light coming from a scene 20 to be picked up. The scene 20 is exposed by a lamp 21 diagrammatically shown and the light reflected by the scene is projected through an objective lens 22 onto a light beam splitter 23. The beam splitter 23 splits the light in the three primary colours red R, Green G and blue B whose optical paths are denoted by $24_R$, $24_G$ and $24_B$. Mirrors $25_R$ and $25_B$ are shown in the optical paths $24_R$ and $24_B$. The mirror $25_R$ reflects the red light in the optical path $24_R$ to a television pick-up tube or panel $26_R$. The green light in the optical path $24_G$ is directly projected onto a pick-up tube or panel $26_G$, while the mirror $25_B$ in the optical path $24_B$ projects the blue light onto a pick-up tube or panel $26_B$. The pick-up tubes 26 are considered to be formed with deflection means, focussing means etc. under the influence of which an electron beam converts a potential image corresponding to the optical image projected onto it line by line and field by field into image signals R, G and B. Outputs of the pick-up tube 26 are connected to pre-amplifiers 27. The output of the pre-amplifier $27_G$ is connected to an output $28_G$ of the colour television camera according to FIG. 4. According to the invention the outputs of the pre-amplifiers $27_R$ and $27_B$ are not directly connected to outputs $28_R$ and $28_B$ of the camera, but through signal multipliers $14_R$ and $14_B$, respectively, inputs of which are connected for the purpose of adjusting the multiplication factor to the outputs $3_R$ and $3_B$ of the controllable current sources $1_R$ and $1_B$, respectively. The inputs $2_R$ and $2_B$ of the current sources $1_R$ and $1_B$ are connected through a transmission path 29 to outputs conveying control voltages $U_{CR}$ and $U_{CB}$ of a controllable direct voltage source 30. The direct voltage source 30 is present in, for example, a control rack located at a distance from the colour television camera with the components 1 to 14 and 22 to 28. The embodiment shown in FIG. 4 of the current source $1_B$ which applies a current $I_{CB}$ to the output $3_B$ is substantially identical to that given in FIG. 1. A difference is that the connection point between the resistor 5 and the (+) input of the amplifier 4 is connected through a resistor 5' to ground so that there is a degree of freedom in the choice of a desired collector current of the transistor 8 and the variation thereof as a function of the control voltage at the input $2_B$.

The necessity of using the signal multipliers $14_R$ and $14_B$ in conjunction with the current sources $1_R$ and $1_B$ is illustrated with reference to the following. When the light from the scene 20 supplied by the lamp 21 or by the sun is white, the pick-up tubes 26 and the preamplifiers 27 will provide image signals of the same instantaneous values through the adjustments performed. It is to be noted that white corresponds to a total reflection without variation in the wavelength composition of the light projected onto the scene 20. In case of a display on a display device suitable for colour television the image signals of the same instantaneous values will yield a white coloured image. Such an adjustment of the pick-up tubes 26 and the pre-amplifier 27 is performed, for example, when the light provided by the lamp 21 corresponds to light given off by black body at a temperature of 3200°K. Thus a determined colour temperature may be given to the (white) light from each lamp. When after the adjustment of the pick-up tubes 26 and the pre-amplifiers 27 with R = G = B for white light at a colour temperature of 3200°K the scene is exposed by a lamp 21 having a different colour temperature, the wavelength composition of the light received by the camera is also varied. When using, for example, a lamp 21 having a colour temperature of the light of 6000°K, the blue light component has increased and the red one has decreased. In case of display, the result is that a white coloured scene part, that is to say, a scene part reflecting the light uninfluenced is bluish discoloured. At a lower colour temperature of the light a reddish discolouration of white occurs upon display.

To avoid the discolouration occurring in case of a change of the scene exposure, the pick-up tubes 26 and the pre-amplifiers 27 would have to be readjusted for each scene exposure change, which is impracticable. The exposure variations occur, for example, when a camera is brought from one to the other place with a different lighting or when it is used for outdoor operation.

It has hitherto been common practice to perform the adjustment of the camera tubes and the pre-amplifiers 27 for a colour temperature of 3200°K and to compensate for scene exposure variations by incorporating an assembly of optical filters between the objective lens and the beam splitter 23. Dependent on the spectral composition of the light coming from the scene 20 and hence on the lamp 21 an optical filter is provided in front of the beam splitter 23 which varies the spectral composition of the light in such a manner that it approximates this composition to such a value as is associated with the colour temperature of 3200°K. The optical filter solution is unattractive due to the following drawbacks: only a coarse adaptation of the spectral composition of the light is possible, the filter placed in front gives a reduction of the camera sensitivity, the assembly of the filters requires extra space so that the optical system cannot be formed as compact as possible and the filters are expensive.

To avoid the unattractive optical filter solution the signal multipliers $14_R$ and $14_B$ and the controllable current sources $1_R$ and $1_B$ are provided in the camera according to FIG. 4 for performing an electronic correction of the colour temperature variation in the light from the scene.

FIG. 4 shows that the pre-amplifier $27_R$ supplies, for example, a signal $R_W = U_{W1}$, the pre-amplifier $27_G$ supplies a signal $G_W = U_{W0}$ and the pre-amplifier $27_B$ supplies a signal $B_W = U_{W2}$. The reference W for the signals R, G and B denotes that they are associated with a white-coloured scene part while $U_W$ denotes, for example, the so-called peak white value at a maximum signal for white. Starting from $G_W = U_{W0}$ as a reference there follows that a white coloured scene part on display is likewise white when there applies that $R_W = U_{W0}$ and $B_W = U_{W0}$. When as is shown in FIG. 4 the pre-amplifiers $27_R$ and $27_B$ do not supply such a signal, the signal multipliers $14_R$ and $14_B$ are adjusted with the aid of the controllable current sources $1_R$ and $1_B$ in such a manner that these signals do occur at the outputs $28_R$ and $28_B$.

FIG. 5 shows a detailed embodiment of a signal multiplier 14 as a load for the current source 1 and furthermore an embodiment of the non-linear resistance network 6 with resistors and biassed diodes is shown. The reference 40 denotes a potentiometer which forms part of the controllable direct voltage source 30. The potentiometer 40 is connected between a terminal conveying the voltage $+U_{S3}$ and ground while the tap is connected to the transmission path 29. For the said control voltage range of from 0 to +5 volt the voltage $U_{S3}$ is 5 volt.

In the current source 1 the connection point of the (+) input of the amplifier 4 and the resistors 5 and 5' is connected to an anode of a diode 11 the cathode of which is connected to the cathodes of some diodes 42, 43, 44 and 45 and to the collector of the transistor 8. The anode of the diode 42 is connected to the connection point between two resistors 46 and 47 which are arranged in series between a terminal conveying the voltage $+U_{S1}$ and ground. Likewise the anodes of the diodes 43, 44 and 45 are connected to connection points between respective resistors 48, 49; 50, 51 and 52, 53. The voltages at the said connection points are successively denoted by $U_1$, $U_2$, $U_3$ and $U_4$ while the diodes 42, 43, 44 and 45 in a possibly conducting state convey currents $I_1$, $I_2$, $I_3$ and $I_4$. The diode 41 conveys in all cases a current denoted by $I_0$.

It has been described with reference to FIG. 1 that for the control voltage $U_C$ equal to the ground potential transistor 8 conveys a maximum adjusted current $I_C$ which for a control range up to +5 volt for this value decreases to a current considered as being minimum. At +5 volt at the (−) input of the amplifier 4 it is also present at the (+) input so that for a voltage drop of 0.7 volt across a conducting diode the cathode of the (then only) conducting diode 41 conveys +4.3 volt. The voltages $U_1$, $U_2$, $U_3$ and $U_4$ are chosen in such a manner that for a voltage +4.3 volt at the interconnected cathodes of the diodes 42, 43, 44 and 45 they cannot conduct. However, when the value of the control voltage $U_C$ is decreased, it will be followed by the input voltage at the (+) amplifier input and for a determined value the diode 42 becomes conducting with a current $I_1$. For a value which is still lower the diode 43 follows with the current $I_2$, then the diode 44 follows with the current $I_3$ and finally the diode 45 with the current $I_4$ becomes conducting so that the current $I_C$ is equal to the sum of the currents $I_0$ to $I_4$.

For the purpose of illustration some voltage and resistance values as may occur in the circuit diagram according to FIG. 5 follow:

resistor 5: 8450 Ω
resistor 5': 9090 Ω
resistor 7: 2150 Ω
resistors 9-12 : 17800 Ω
resistors 10-13: 2050 Ω
resistors 46: 38300 Ω
resistor 47: 17800 Ω
resistor 48: 9530 Ω
resistor 49: 2610 Ω
resistor 50: 28700 Ω
resistor 51: 4020 Ω
resistor 52: 20500 Ω
resistor 53: 1470 Ω
voltage $U_{S1}$: 12 volt
voltage $U_{S2}$: 6 volt.

The above-mentioned values have the result that when linearly stepping up the control voltage $U_C$ from 0 to +5 volt the current $I_C$ decreases in accordance with a logarithmic function from 4 mA. to 0.4 mA. The resultant 20 dB current control across an input voltage of 5 volt results in a 4 dB current control per volt.

The current $I_C$ at the output 3 of the current source 1 becomes available for the signal multiplier 14. In the signal multiplier 14 the output 3 of the current source 1 is connected to the connection point between two equal resistors 54 and 55 which are arranged in series between the emitters of two npn transistors 56 and 57. The bases of the transistors 56 and 57 are connected together through a resistor 58 and the signal R or B is applied between the bases to inputs 59 and 60. The value of the resistor 58 is equal to the characteristic resistance of a cable (not shown) connected to the inputs 59 and 60. In FIG. 5 the signal R, B is shown as a function of time plotted with a slope starting from black level at the ground potential of 0 volt to peak white value of $U_{W1,2}$ and a subsequent steep negative slope.

The collector of the transistor 56 is connected to the base of an npn transistor 61 and to the emitter of an npn transistor 62 whose collector is connected to a terminal conveying the voltage $+U_{S2}$. Likewise the collector of the transistor 57 is connected to the base and the emitter of transistors 63 and 64, respectively. For obtaining a bias the bases of the transistors 62 and 64 are connected to the connecting point between a resistor 65 and two series-arranged diodes 66 and 67 which together are provided between a terminal conveying the voltage $+U_{S2}$ and ground. The emitters of the transistors 61 and 63 are connected through a resistor 68 to a terminal conveying the voltage $-U_{S1}$. The collectors of the transistors 61 and 63 are connected through resistors 69 and 70 to terminals conveying the voltage $+U_{S2}$ and are directly connected to a (+) and a (−) input, respectively, of an operational amplifier 71. The (+) input of the amplifier 71 is connected through a resistor 72 to ground and the (−) input is connected to the output through a feedback resistor 73 which is furthermore connected through a resistor 74 to an output 75 of the signal multiplier 14. The value of the resistor 74 is equal to, for example, that of the resistor 58. The multiplier 14 provides the signal R, B between the output 75 and an output 76 connected to ground, which signal varies between the black level with the ground potential 0 and the peak white value $+U_{W0}$. The standardized value $+U_{W0}$ is to be, for example, +200 mV.

The operation of the signal multiplier 14 is as follows, starting from a current $I_C$ having a determined adjusted value. If there is no signal R, B, the bases of the transistors 56 and 57 will have the same voltage of, for example, the ground potential 0 and the transistors 56 and 57 will both convey an equally large current of $I_{C/2}$ which likewise flows through the transistors 62 and 64. The transistors 61 and 63 thus also convey equal currents. The resistors 69, 70, 71 and 73 have been proportional in such manner that the voltage at the (+) and (−) inputs of the amplifier 71 is the same and is, for example, $+U_a$; the operational amplifier 71 then has the ground potential at the output. For the values of the resistors 69 and 70 and 72 and 73 there applies that they are equal.

When subsequently a positive voltage occurs in the signal R, B, the input 59 will become more positive than the input 60 and the transistor 56 will start to convey more current whereas the transistor 57 will conduct equally less. The same applies to the transistors 62 and 64 so that the transistor 61 starts to convey less current than transistor 63. The voltage drop across the resistor 69 becomes smaller and that across the resistor 70 becomes largers so that the (+) input of the amplifier 71 has a larger positive voltage than the (−) input. The output 75 will therefore start to convey a positive voltage.

When subsequently the peak white value $+U_{W1,2}$ occurs in the signal R, B the voltage at the (+) input of the amplifier 71 may have increased, for example, by a value of $+\Delta U$ while that at the $(-)$ input has decreases by $-\Delta U$. The difference of $2\Delta U$ results in the voltage $+U_{W0}$ in the signal R, B at the output 75.

As described with reference to FIG. 4 the voltage $+U_{W0}$ is to be adjusted at a standardized value of, for example, 200 mV while the voltage $U_{W1}$ or $U_{W2}$ may have an arbitrary value dependent upon the lighting of the scene. As an example there applies that the voltage $U_{W1,2}$ may be between 60 and 600 mV. When after a changed scene lighting the value $U_{W1}$ or $U_{W2}$ has decreased, for example, so that the standardized value of $+U_{W0}$ is not achieved in the signal R or B occurring at the output 75, the multiplication factor of the signal multiplier 14 is to be increased. This means that the value $\Delta U$ must be increased which is effected when the adjusted current $I_C$ is reduced. The reduction of the current $I_C$ results in a reduction of the current flowing through the transistors 62 and 64 active as diodes so that their base-emitter diode has a larger differential resistance resulting in the present too small input voltage between the inputs 59 and 60 producing larger input voltages across the base-emitter diode of the transistors 61 and 63. the value $\Delta U$ is therefore increased while the voltage $+U_a$ remains the same due to the non-varied current flowing through the resistor 68.

As is apparent from the description of the current source 1 the voltage $U_C$ is to be increased for the reduction of the current $I_C$ and conversely. The multiplication factor of the signal multiplier 14 is adjustable in accordance with a logarithmic function by a linear variation of the control voltage $U_C$ with the aid of the non-linear resistance network 6 formed with the diodes 41 to 45 and the resistors 46 to 53. The multiplication factor may be adjusted, for example, between ⅓ and 3 ⅓.

For the embodiment of the current source 1 shown in FIG. 5 formed with the non-linear resistance network 6 and the embodiment of the signal multiplier 14 there applies that due to the absence of capacitive and inductive components the embodiment may be integrated in a semiconductor body.

What is claimed is:

1. A controllable current source comprising a first supply input terminal, control input means for receiving a control voltage, and an output terminal; an operational amplifier having a first high impedance input coupled to said control input means, a second input, and an output; a first resistor coupled between said second input and said supply input; current mirror feedback means comprising a first and second transistors each having control and collector electrodes, said control electrodes being coupled together; a non-linear resistance network coupled between said first transistor collector and said amplifier second input, the control electrode of said first transistor being coupled to said amplifier output, and said second transistor collector being coupled to said output terminal.

2. A controllable current source as claimed in cliam 1, further comprising a second supply terminal and a second resistor coupled to the amplifier second input and to said second supply terminal conveying a voltage different from said first supply terminal.

3. A controllable current source as claimed in claim 1 wherein said control electrodes each comprise a base and said transistors each further comprises an emitter electrode and, further comprising a second resistor coupled between the output of the amplifier and the bases of said two transistors in the current mirror feedback means, third and second supply terminals conveying the same voltages, and equal load means coupled between said third and second terminals respectively and said emitters respectively.

4. A controllable current source as claimed in claim 1 wherein said control electrodes each comprises an emitter and said transistors each further comprises a base electrode and further comprising two resistors of the same value respectively coupled to the emitters of the said two transistors in the current mirror feedback means and to said amplifier output, and second and third supply terminals conveying the same voltages coupled to said bases respectively.

5. A controllable current source as claimed in claim 1, further comprising a signal multiplier having a first input coupled to said current source and a second input means for receiving an image signal to be multiplied.

6. A controllable current source as claimed in claim 1, further comprising a remote, controllable direct voltage source coupled to said control input means.

7. A controllable current source as claimed in claim 1, wherein the current of the current source depends in accordance with a logarithmic function on said control voltage.

* * * * *